(12) United States Patent
Dong et al.

(10) Patent No.: US 6,878,588 B2
(45) Date of Patent: Apr. 12, 2005

(54) METHOD FOR FABRICATING A FLASH MEMORY CELL

(75) Inventors: Cha Deok Dong, Ichon-Shi (KR); Kwang Chul Joo, Yongin-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/287,783

(22) Filed: Nov. 5, 2002

(65) Prior Publication Data

US 2003/0119256 A1 Jun. 26, 2003

(30) Foreign Application Priority Data

Dec. 22, 2001 (KR) .................................... 2001-0083494

(51) Int. Cl.⁷ .......................................... H01L 21/336
(52) U.S. Cl. ..................................................... 438/257
(58) Field of Search ................................ 438/257–267, 438/FOR 203; 257/314–320, E29.19, E21.422, E21.68, E29.129

(56) References Cited

U.S. PATENT DOCUMENTS

| | | | |
|---|---|---|---|
| 5,637,520 A | * | 6/1997 | Cappelletti et al. ......... 438/258 |
| 6,121,095 A | * | 9/2000 | Tai et al. ..................... 438/287 |
| 6,153,494 A | * | 11/2000 | Hsieh et al. ................. 438/424 |
| 6,376,877 B1 | * | 4/2002 | Yu et al. ...................... 257/317 |
| 6,486,039 B2 | * | 11/2002 | Yoo et al. .................... 438/425 |
| 6,486,517 B2 | * | 11/2002 | Park ............................ 257/374 |
| 6,492,240 B1 | * | 12/2002 | Wang et al. ................. 438/382 |
| 6,518,148 B1 | * | 2/2003 | Cheng et al. ............... 438/437 |
| 2003/0102503 A1 | * | 6/2003 | Rabkin et al. .............. 257/315 |
| 2003/0119257 A1 | * | 6/2003 | Dong et al. ................. 438/257 |
| 2003/0119259 A1 | * | 6/2003 | Jeong et al. ................ 438/257 |
| 2003/0119260 A1 | * | 6/2003 | Kim et al. ................... 438/257 |
| 2003/0119263 A1 | * | 6/2003 | Lee et al. .................... 438/259 |

* cited by examiner

Primary Examiner—George Fourson
Assistant Examiner—Brook Kebede
(74) Attorney, Agent, or Firm—Mayer, Brown, Rowe & Maw LLP

(57) ABSTRACT

The present invention relates to a flash memory cell and method of manufacturing the same. The flash memory cell comprises a trench for defining a semiconductor substrate to be an active region and an inactive region, a trench insulating film burying the trench and having a given protrusion, an impurity region formed in the active region, a floating gate isolated by the protrusion and having rugged portions, and a dielectric film and a control gate formed on the floating gate. Therefore, the present invention can significantly simplify the process, improve the yield of a product and reduce the manufacturing cost.

26 Claims, 7 Drawing Sheets

METHOD FOR FABRICATING A FLASH MEMORY CELL

BACKGROUND OF THE INVENTION

1. Field of the Invention

The invention relates generally to a flash memory cell and method of manufacturing the same. More particularly, the invention relates to a flash memory cell and method of manufacturing the same, which can prevent a moat generated when a self-aligned floating gate of a flash memory cell is formed and can improve the coupling ratio between the floating gate and a control gate.

2. Description of the Prior Art

In general, a flash memory cell is implemented by a shallow trench isolation (STI) process using a device isolation process. When the isolation process of a floating gate using mask patterning is performed, wafer uniformity is very bad depending on variations in the critical dimension (CD). It is thus difficult to implement a uniform floating gate. Further, there is a problem of programming and erasure fail in the memory cell depending on variations in the coupling ratio. Also, the mask process is made further difficult in implementing a small spacer of below 0.15 $\mu$m in view of a higher-integrated design. As a result, a process of manufacturing the flash memory cell being an important factor in implementing the uniform floating gate is made further difficult.

Due to the above problems, if the floating gate is not uniformly formed, the memory cell is over erased when the memory cell is programmed and erased since the difference in the coupling ratio is large. As a result, there are problems that the operating speed of the device is lowered and the operation of the device at a low voltage is made impossible. Due to addition of the mask process, there are problems that the yield of the product is lowered and the cost of the product is increased. Further, there is a problem of a fail in the device, etc. due to a moat (i.e., a shape in which an active region of the field oxide film is concaved by a subsequent etch process) that generates in the STI process or nitride-spacer local oxidation of silicon (NS-LOCOS) process. It is therefore necessary to increase the coupling ratio by securing a cell in which the moat is not generated in a flash device of a high-integration level.

SUMMARY OF THE INVENTION

The present invention is contrived to solve the above problems and an object of the present invention is to provide a method of manufacturing a flash memory without using a mask process is reduced, which can improve the yield of a product, reduce the manufacturing cost and thus improve a characteristic of a device.

In order to accomplish the above object, a flash memory cell according to the present invention, is characterized in that it comprises a trench for defining a semiconductor substrate to be an active region and an inactive region, a trench insulating film burying the trench and having a given protrusion, an impurity region formed in the active region, a floating gate isolated by the protrusion and having rugged portions, and a dielectric film and a control gate formed on the floating gate.

Further, a method of manufacturing a flash memory cell according to the present invention is characterized in that it comprises the steps of forming a pad layer on a semiconductor substrate, forming a trench at the semiconductor substrate, forming a trench insulating film having a protrusion sufficient to bury the trench, forming a floating gate isolated by the protrusion, wherein an upper portion of the floating gate has rugged portions, and forming a dielectric film and a control gate on the floating gate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
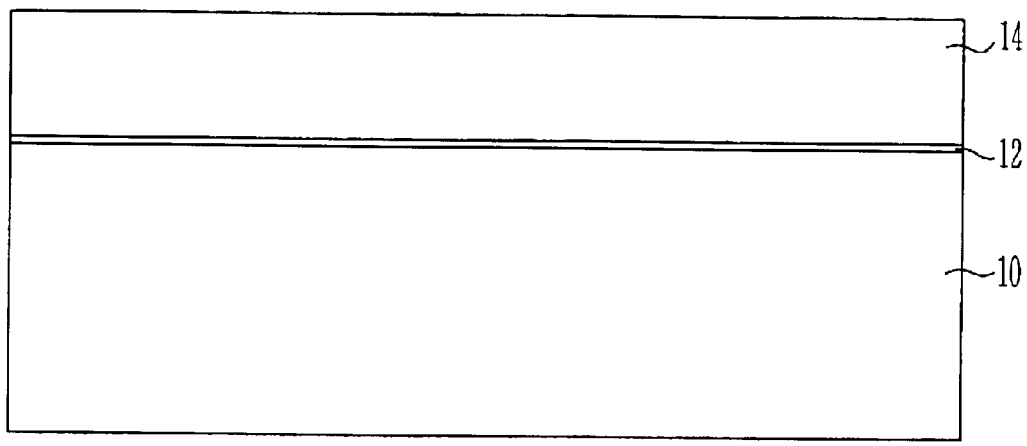
FIG. 1A through FIG. 1O are flash memory cells and cross-sectional views of the flash memory cells for explaining a method of manufacturing the flash memory cell according to a preferred embodiment of the present invention.
Figure 1B:
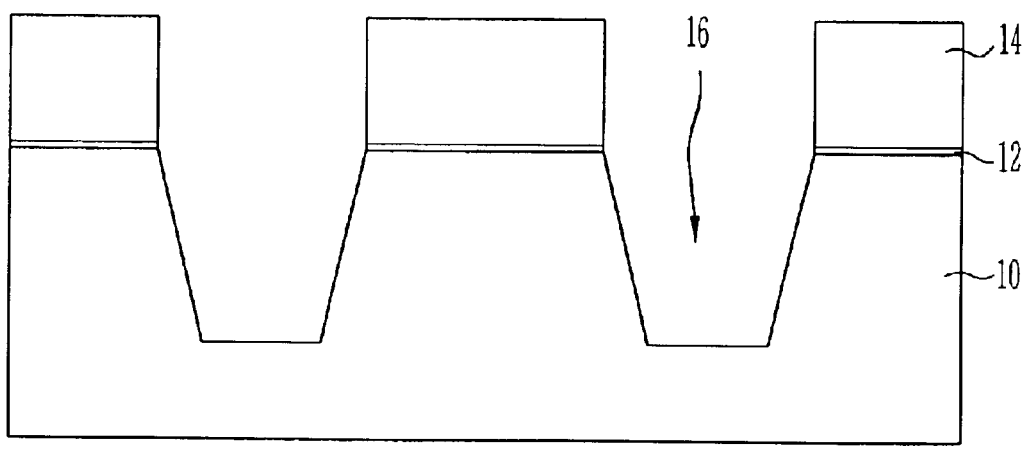
Figure 1C:
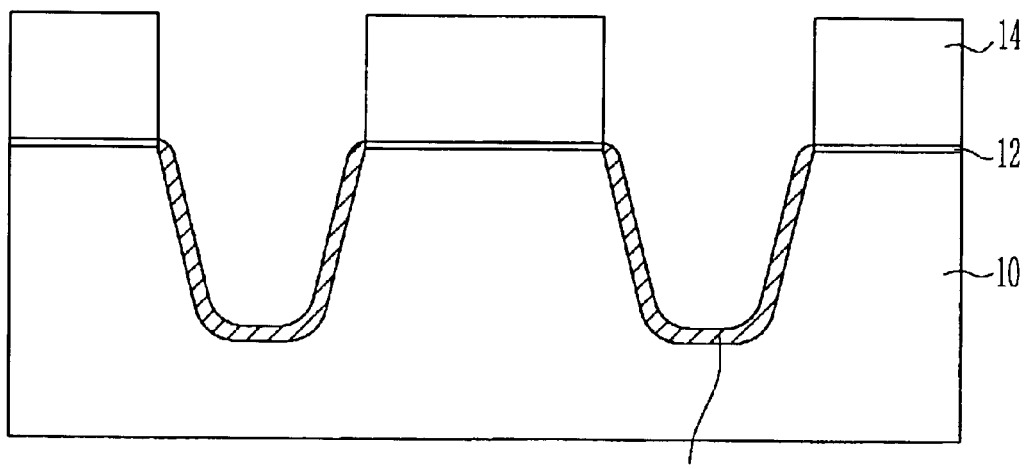
Figure 1D:
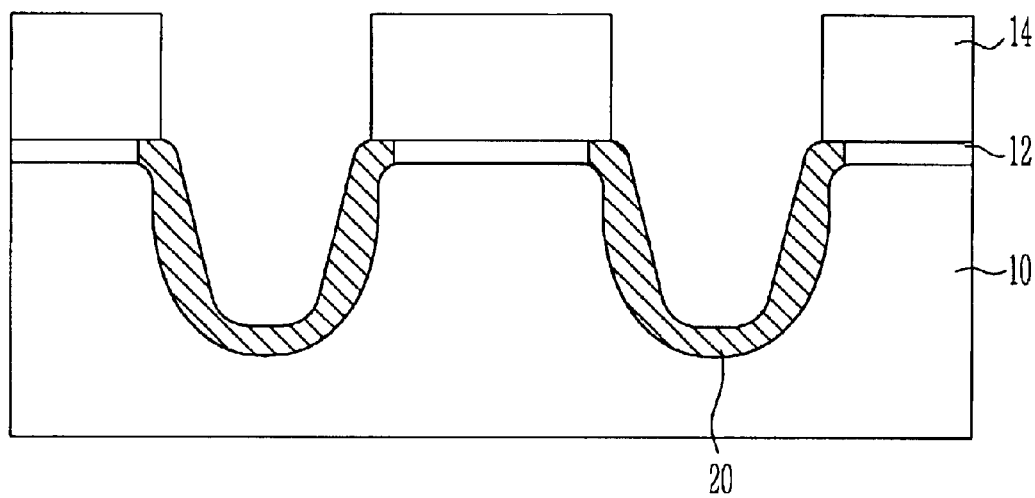
Figure 1E:
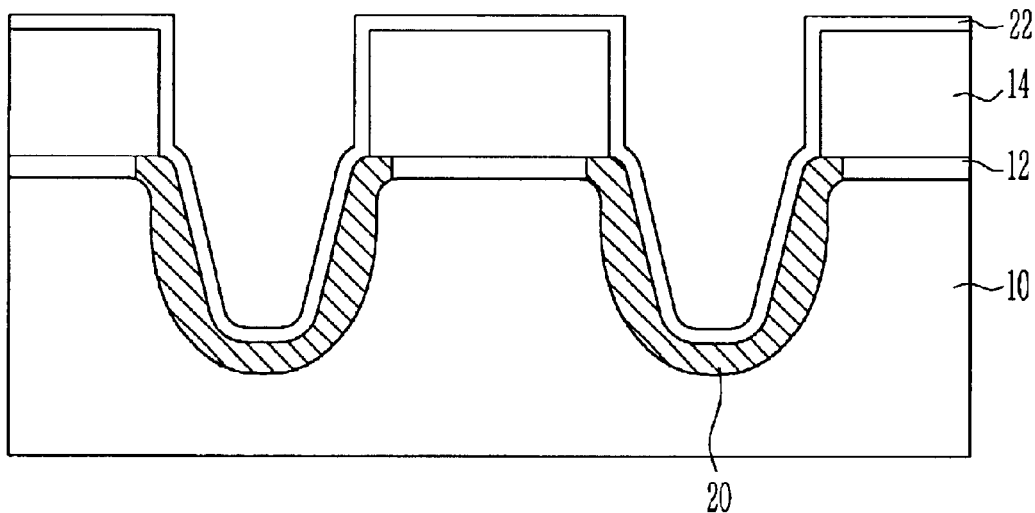
Figure 1F:
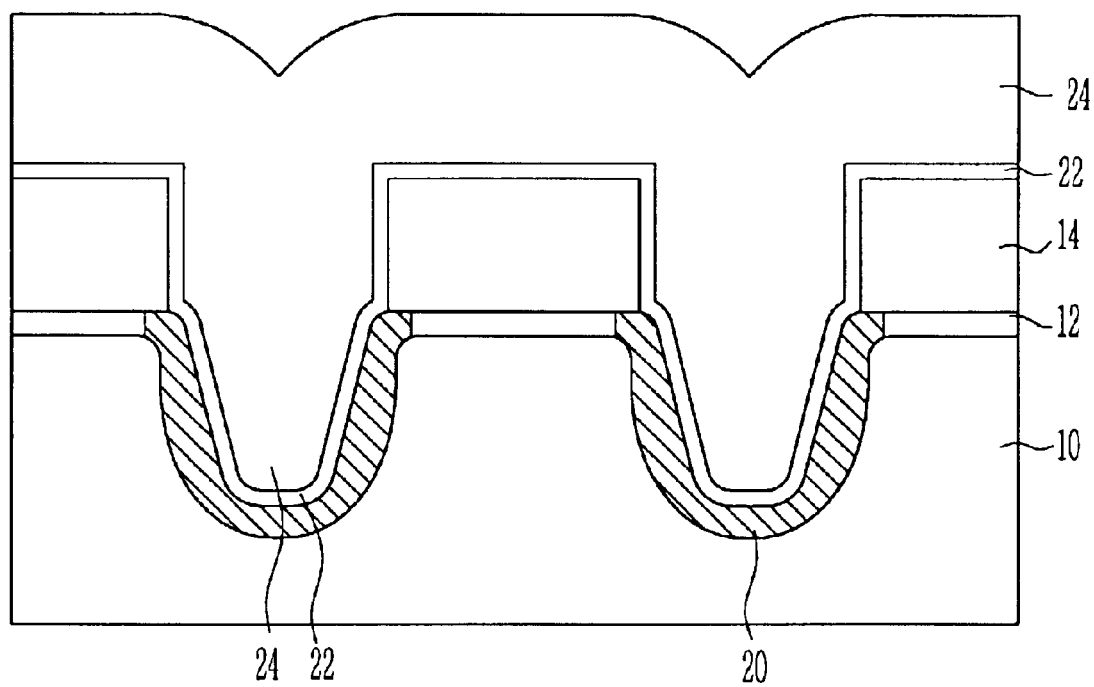
Figure 1G:
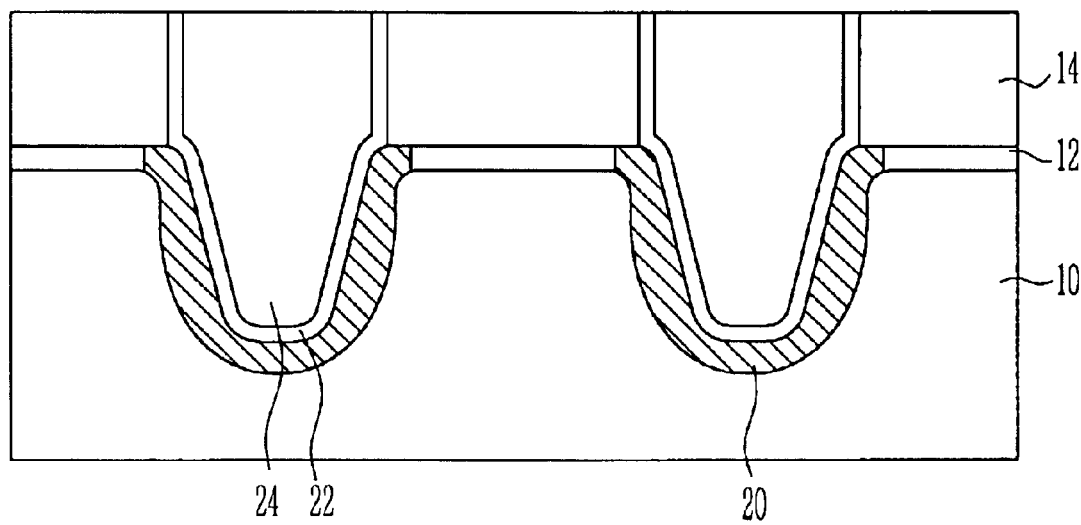
Figure 1H:
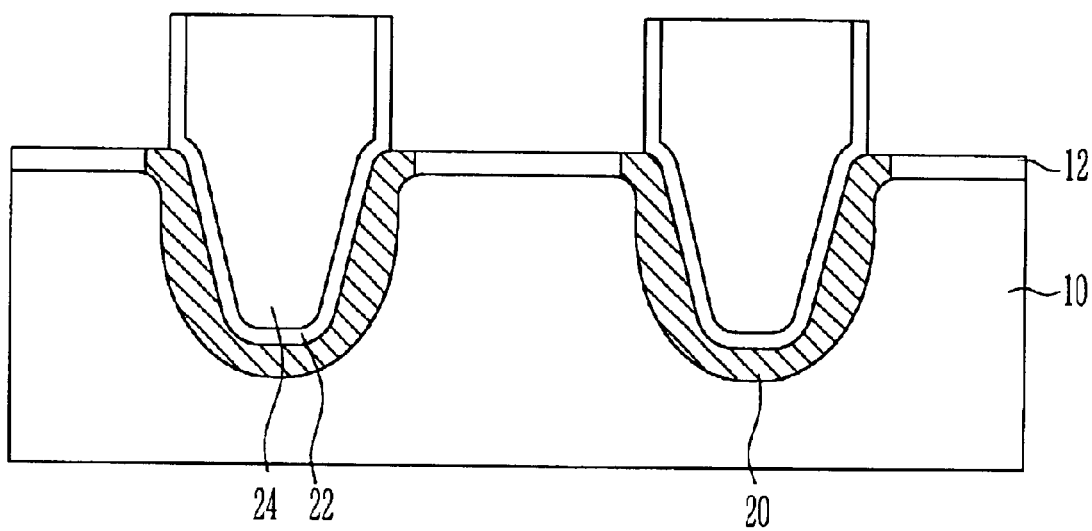
Figure 1I:
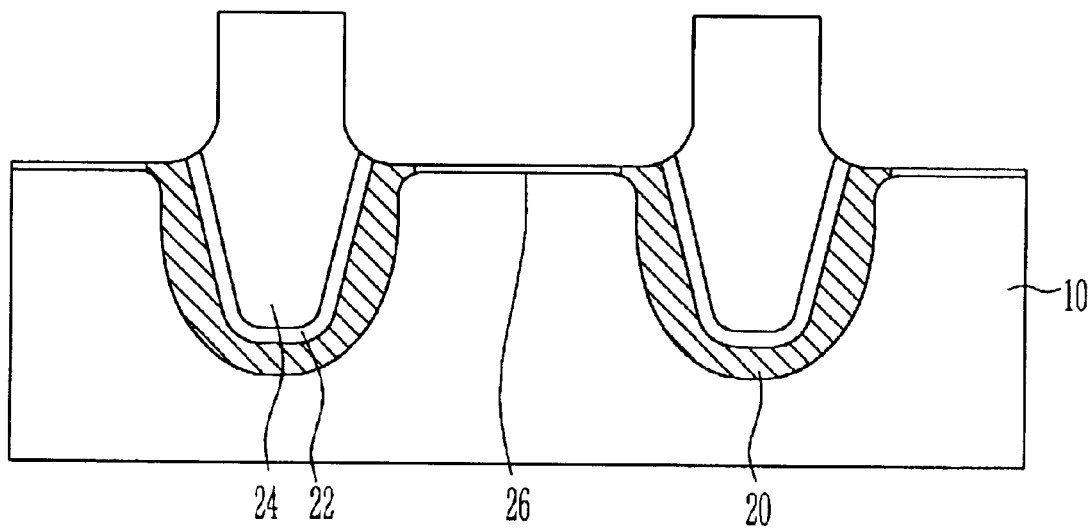
Figure 1J:
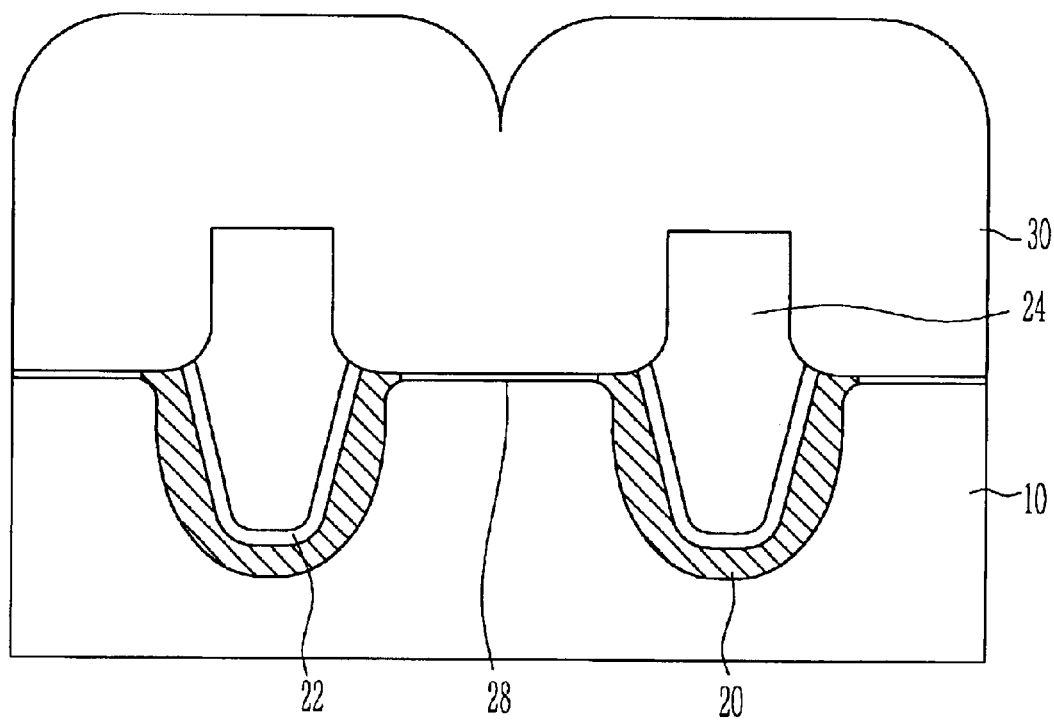
Figure 1K:
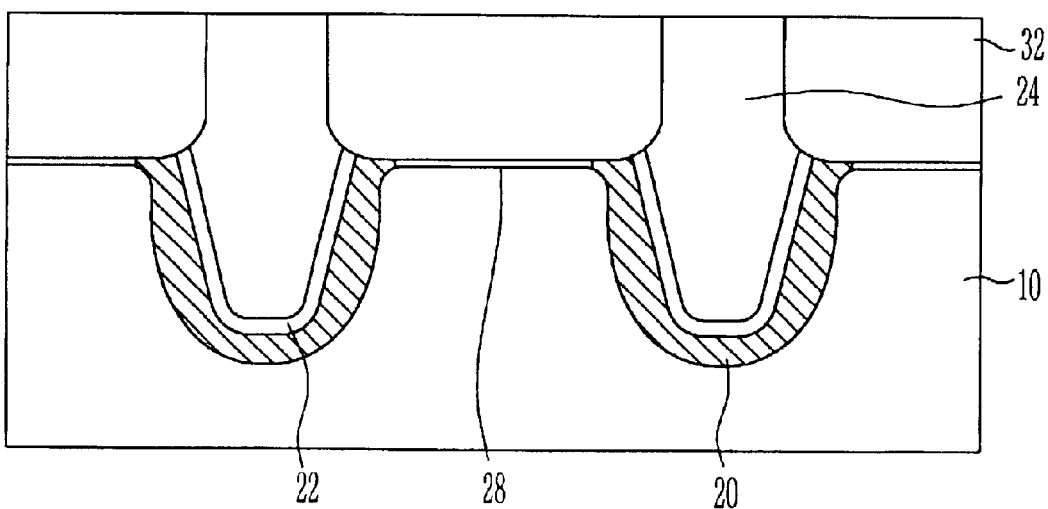
Figure 1L:
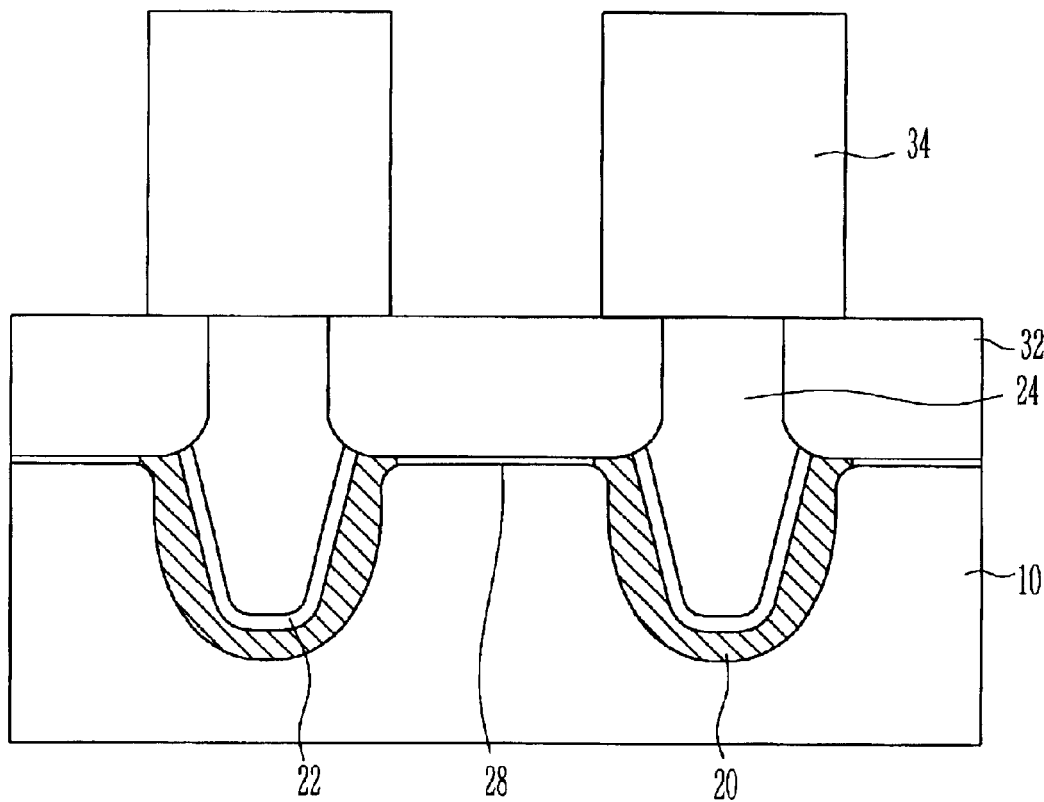
Figure 1M:
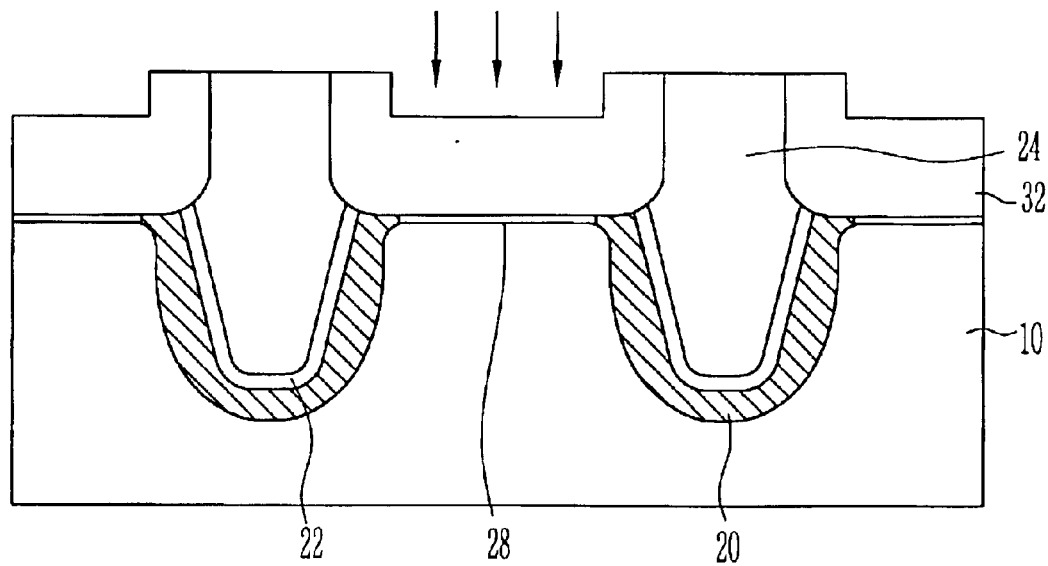
Figure 1N:
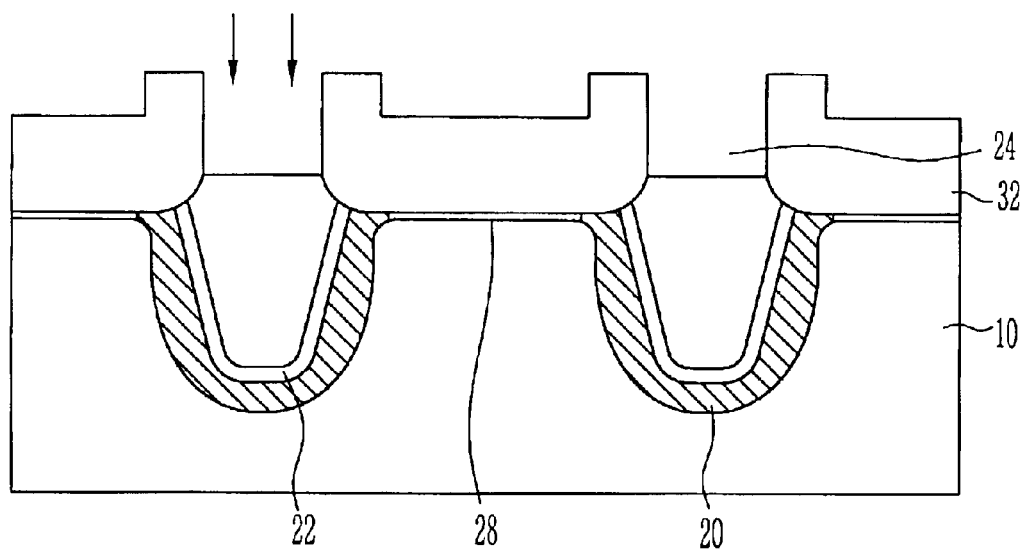
Figure 1O:
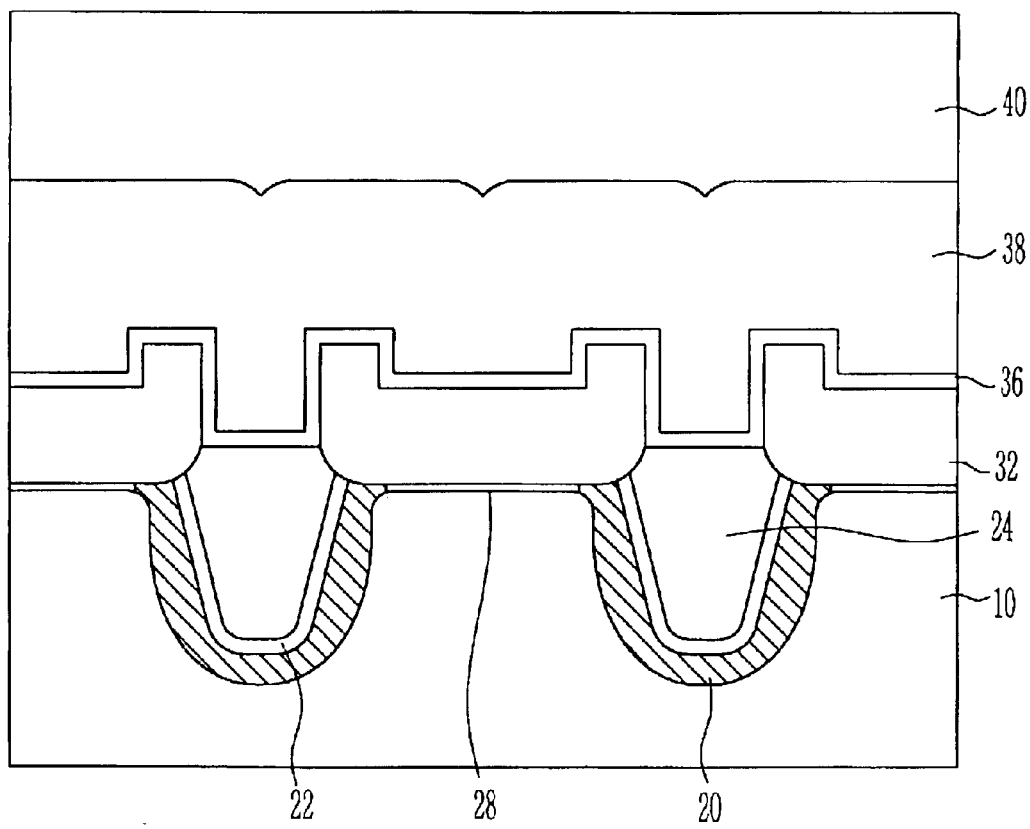

FIG. 1A through FIG. 1O are flash memory cells and cross-sectional views of the flash memory cells for explaining a method of manufacturing the flash memory cell according to a preferred embodiment of the present invention.

Referring now to FIG. 1A, a pad oxide film 12 and a pad nitride film 14 are sequentially formed on a semiconductor substrate 10. At this time, the pad oxide film 12 is formed in thickness of 70 through 100 Å by means of a dry or wet oxidization method at a temperature of 750 through 900° C. in order to process crystal defects on the semiconductor substrate 10 or the surface of the semiconductor substrate 10. A pad nitride film 16 is then formed in thickness of 2500 through 3500 Å by means of a low-pressure chemical vapor deposition (LP-CVD) method.

Also, the semiconductor substrate 10 is cleaned by a pre-treatment cleaning process before the pad oxide film 12 is formed. At this time, the cleaning process includes the processes of containing the semiconductor substrate 10 within a container into which diluted HF (DHF, a HF solution where $H_2O$ is diluted at the ratio of 50:1) or buffer oxide etchant (BOE, a solution where HF and $NH_4F$ are mixed at the ratio of 100:1 or 300:1) is filled, cleaning the semiconductor substrate 10 using de-ionized (DI) water, dipping the semiconductor substrate 10 into a container into which SC-1 (a solution where $NH_4OH/H_2O_2/H_2O$ solution is mixed at a given ratio) is filled in order to remove particles remained on the semiconductor substrate 10, cleaning the semiconductor substrate 10 using DI water again and then drying the semiconductor substrate 10.

Referring now to FIG. 1B, given portions of the semiconductor substrate 10 including the pad nitride film 14 and the pad oxide film 12 are etched by a shallow trench isolation (STI) process using an isolation (ISO) mask, thus forming a trench 16 by which a given portion of the semiconductor substrate 10 is concaved. At this time, an inner surface of the trench 16 has a tilt angle of about 75° through 85° and the pad nitride film 14 has an almost vertical profile. Further, the semiconductor substrate 10 is divided into an active region and an inactive region (i.e., a region in which the trench is formed) by the trench 16.

By reference to FIG. 1C, silicon at the inner surface of the trench 16 is grown by a wall sacrificial (SAC) oxidization process using a dry oxidization method, so that a sacrificial oxide film 18 having a thickness of 150 through 250 Å is formed on the inner surface of the trench 16. At this time, the wall SAC oxidization process is performed with a dry oxidization method at a temperature of 1000 through 1150° C. in order to compensate for etch damage on the inner surface of the trench 16 and make rounded an edge portion (i.e., a portion where the pad oxide film contacts) of the top portion.

Also, before the wall SAC oxidization process is performed, the pretreatment cleaning process is performed in order to remove a native oxide film formed on the inner surface of the trench 16. At this time, the pre-treatment cleaning process includes the processes of containing the semiconductor substrate 10 into the container into which DHF or BOE is filled, cleaning the substrate 10 using DI water, containing the substrate 10 into the container where SC-1 is filled in order to remove particles, cleaning the substrate 10 using DI water again and then drying the substrate 10.

Referring now to FIG. 1D, a cleaning process using the thickness of the sacrificial oxide film 18 as a target is performed in order to remove the sacrificial oxide film 18. A wall oxidization process is then performed in order to make rounded the bottom of the trench 16. Due to this, the wall oxide film 20 having a thickness of 300 through 450 Å is formed on the inner surface of the trench 16. At this time, the wall oxidization process is performed with a wet oxidization process at a temperature of 750 through 850° C.

At this time, the cleaning process for removing the sacrificial oxide film 18 includes the processes of containing the semiconductor substrate 10 into the container into which DHF or BOE is filled, cleaning the substrate 10 using DI water, containing the substrate 10 into the container where SC-1 is filled in order to remove particles, cleaning the substrate 10 using DI water again and then drying the substrate 10.

By reference to FIG. 1E, high temperature oxide (HTO) containing DCS ($SiH_2Cl_2$) as an integral component is thinly deposited on the entire surfaces. High temperature oxide (HTO) is then experienced by a fineness process at a high temperature, thus forming a liner oxide film 22 having a thickness of 100 through 120 Å. At this time, the fineness process is performed under a $N_2$ atmosphere at a temperature of 1000 through 1100° C. for 20 through 30 minutes. As the texture of the liner oxide film 22 is made fine by the fineness process, the etch resistance is increased. Due to this, formation of a moat generating when the STI process is performed can be prohibited and a leakage current can be also prevented.

Referring to FIG. 1F, the entire surfaces are experienced by a deposition process using a high-density plasma (HDP) oxide film so that the trench 16 is buried. A trench insulating film 24 having a thickness of 5000 through 10000 Å is thus formed. At this time, the process of depositing the trench insulating film 24 is performed using a gap filling process so that void does not occur within the trench 16.

Referring now to FIG. 1G, the trench insulating film 24 is polished by a chemical mechanical polishing (CMP) process using the pad nitride film 14 as a stop barrier. By the process, the trench insulating film 24 is isolated with the pad nitride film 14 intervened. At this time, the CMP process is performed so that the pad nitride film 14 is not over etched.

By reference to FIG. 1H, the pad nitride film 14 is removed by a strip process using $H_3PO_4$ dip out using the pad oxide film 12 as the stop barrier. Thus, a trench insulating film 24 an upper structure of which is protruded is formed.

Referring now to FIG. 1I, in order to remove the pad oxide film 12 and simultaneously etch the protrusion of the trench insulating film 24 by a given width, the entire surfaces are experienced by a cleaning process using HF dip out using the pad oxide film 12 as the stop barrier. At this time, the cleaning process includes the processes of containing the semiconductor substrate 10 into the container into which DHF or a buffer oxide etchant (a solution where HF and $NH_4F$ are mixed at the ratio of 100:1 or 300:1; hereinafter "BOE") is filled, cleaning the substrate 10 using DI water, containing the substrate 10 into the container where standard cleaning-1 solution (a solution where $NH_4OH/H_2O_2/H_2O$ solution is mixed at a given ratio; hereinafter "SC-1") is filled in order to remove particles, cleaning the substrate 10 using DI water again and then drying the substrate 10. Also, the cleaning process includes controlling the dip time and setting the deposition thickness of the pad oxide film 12 as an etch target. As the trench insulating film 24 can be etched by a desired thickness upon the cleaning process, the spacing of the floating gate formed in a subsequent process can be minimized while prohibiting generation of a moat at the trench insulating film 24.

Next, for the purpose of a wall ion implantation process and a threshold voltage (VT) ion implantation process, the upper surface of the active region is experienced by a VT screen oxidation process, thus forming a screen oxide film 26 having a thickness of 50 through 70 Å. At this time, the VT screen oxidization process is performed with a wet or dry oxidization process at a temperature of 750 through 900° C.

By reference to FIG. 1J, the wall ion implantation process is performed to form a wall region (not shown) at the active region of the semiconductor substrate 10. Next, the VT ion implantation process is performed to form an impurity region.

Thereafter, after the screen oxide film 26 is removed by a cleaning process, a tunnel oxide film 28 is formed at a portion from which the screen oxide film 26 is removed. At this time, the tunnel oxide film 28 is formed by performing a wet oxidization process at a temperature of 750 through 800° C. and then performing an annealing process using $N_2$ at a temperature of 900 through 910° C. for 20 through 30 minutes in order to minimize an interfacial defect density with the semiconductor substrate 10. Also, the cleaning process for removing the screen oxide film 26 includes the processes of containing the semiconductor substrate 10 into the container into which DHF or BOE is filled, cleaning the substrate 10 using DI water, containing the substrate 10 into the container where SC-1 is filled in order to remove particles, cleaning the substrate 10 using DI water again and then drying the substrate 10.

Thereafter, in order to minimize the size of a grain and prevent concentration of an electric field, the entire surfaces are experienced by a deposition process using a low-pressure chemical vapor deposition (LP-CVD) method at a temperature of 580 through 620° C. and a low pressure of 0.1 through 3 Torr under a $SiH_4$ or $Si_2H_6$ and $PH_3$ gas atmosphere, thus forming a first polysilicon layer 30 for a floating gate. Further, the first polysilicon layer 30 is formed in thickness of 1000 through 2000 Å by implanting, for example P (in case of P type) with a doping level of 1.5E20 through 3.0E20 atoms/cc.

Referring to FIG. 1K, the first polysilicon layer 30 is polished by the CMP process using the protrusion of the trench insulating film 24 as the stop barrier. By the above process, the first polysilicon layer 30 is isolated with the trench insulating film 24 intervened, thus forming a floating gate 32. At this time, the floating gate 32 is uniformly formed in thickness of 1000 through 1400 Å.

Referring to FIG. 1L, after a negative photoresist is deposited on the entire surfaces, the negative photoresist is patterned by an exposure process using the ISO mask. Thus, a mask 34 for the floating gate 32 is formed so that it is overlapped with a neighboring floating gate 32.

By reference to FIG. 1M, an etch process using the mask 34 for the floating gate 32 is performed using an etch target of 200 through 400 Å, thus patterning an upper portion of the floating gate 32 to have a rugged shape. As such, it is possible to increase the coupling ratio with a control gate to be formed in a subsequent process by forming the upper portion of the floating gate 32 to have the rugged shape so that the maximum surface area can be secured.

Referring now to FIG. 1N, a cleaning process including controlling the dip time is performed to etch the protrusion of the trench insulating film 24 formed between the floating gates 32 by a given thickness. Thereby, the spacing width between the floating gates 32 may be much narrower than one that is implemented by the etch process using the conventional floating gate mask. At this time, the cleaning process includes the processes of containing the semiconductor substrate 10 into the container into which DHF or BOE is filled, cleaning the substrate 10 using DI water, containing the substrate 10 into the container where SC-1 is filled in order to remove particles, cleaning the substrate 10 using DI water again and then drying the substrate 10.

Referring now to FIG. 1O, a dielectric film 36 having an oxide/nitride/oxide (ONO) structure is formed on the entire surfaces. At this time, an oxide film forming an upper portion and lower portion of the dielectric film 36 and having a thickness of 35 through 60 Å is formed by HTO using DCS ($SiH_2Cl_2$) and $N_2O$ gas having a good partial internal pressure and a good time dependent dielectric breakdown (TDDB) characteristic as a source gas. At this time, the oxide film is formed by the LP-CVD method including loading the oxide film at a temperature of 600 through 700° C. and then raising the temperature to 810 through 850° C. at a low pressure of 0.1 through 3 Torr. Further, the nitride film formed between the upper portion and lower portion of the dielectric film 36 is formed in thickness of 50 through 65 Å using $NH_3$ and DCS gas as a reaction gas. At this time, the nitride film is formed by the LP-CVD method at a temperature of 650 through 800° C. and a low pressure of 1 through 3 Torr.

Next, in order to improve the quality of the dielectric film 36 and enhance the interface of the layers formed on the semiconductor substrate 10, an annealing process is performed. At this time, the annealing process is performed with a wet oxidization process at a temperature of 750 through 800° C. Further, the process of forming the dielectric film 36 and the annealing process includes forming a thickness corresponding to the device characteristic. At this time, in order to prevent formation of a native oxide film or contamination of an impurity between the respective layers, the process of forming the dielectric film 36 and the annealing process are performed with almost no time delay.

Thereafter, a second polysilicon layer 38 and a tungsten silicide layer 40 are sequentially formed on the entire surfaces. At this time, the second polysilicon layer 38 is substituted by the dielectric film 36 when the tungsten silicide layer 40 is formed in a subsequent process. In order to prevent diffusion of fluorine (F) that may cause an increase in the thickness of the oxide film, the second polysilicon layer 38 is formed to have a two-layer structure of a doped layer and an undoped layer by the LP-CVD method.

At this time, in order to prohibit formation of a seam and to reduce a sheet resistance of the word line when the subsequent tungsten silicide layer 40 is formed, it is preferred that the total thickness of the doped layer and the undoped layer is 500 through 1000 Å at the ratio of 1:2 through 6:1 so that the spacing of the floating gate 32 can be sufficiently buried. Further, the doped layer and the undoped layer are formed by first forming the doped layer using a doped polysilicon film using a silicon source gas such as $SiH_4$ or $Si_2H_6$ and $PH_3$ gas and then forming the undoped layer with no time delay without providing $PH_3$ gas into the chamber. Also, the second polysilicon layer 38 is formed at a temperature of 510 through 550° C. and a low pressure of 0.1 through 3 Torr.

Meanwhile, the tungsten silicide layer 40 is formed to have a stoichiometry of 2.0 through 2.8 in which an adequate step coverage is implemented and a sheet resistance is minimized, using reaction of MS ($SiH_4$) or DCS and $WF_6$ having a low content of fluorine (F), a low annealing stress and a good adhesive force at a temperature of 300 through 500° C.

Thereafter, an anti-reflection film (not shown) is formed on the entire surfaces using $SiO_xN_y$ or $Si_3N_4$. Next, the anti-reflection film, the tungsten silicide layer 40, the second polysilicon layer 38 and the dielectric film 36 are sequentially etched using the mask for the gate, thus forming the control gate (not shown).

As mentioned above, according to the present invention, only ISO mask process is performed as a mask process until the process of forming a floating gate. Therefore, the present invention has an advantage that it can significantly simplify the process, improve the yield of a product and reduce the manufacturing cost, compared a conventional process including three mask processes of an ISO mask, a key mask and a mask for a floating gate.

Also, during the wall SAC oxidization process and the wall oxidization process, an upper edge of a trench is make rounded by controlling a deposition target. Therefore, the present invention can minimize an active region CD since a smooth trench can be formed.

Further, according to the present invention, a buffer polysilicon film is oxidized after a gap filled HDP oxide film remains and a DHF cleaning process is also performed using a target formed on the active region. Therefore, the present invention has an advantage that it can easily form a profile of STI in which a moat does not occur, by controlling the width of the HDP oxide film protruded in a nipple shape.

In addition, the present invention does not employ a conventional technology including the mask process and the etch process. Therefore, the present invention can easily implement a device of a small size and can minimize variations in the CD depending on a mask process and an etch process. Further, the present invention can implement a uniform floating gate over the entire wafer.

Further, according to the present invention, a uniform floating gate is formed. Therefore, the present invention has advantages that it can improve a characteristic of a flash memory device due to reduced variations in the coupling ratio and can also maximize the coupling ratio due to a small active CD.

Also, in order to increase the surface area of the floating gate, an upper portion of the floating gate is made to have a rugged shape. Therefore, the present invention has an advantage that it can maximize the coupling ratio due to a reduced capacitance applied to the dielectric film In addition, according to the present invention, generation of a moat is prohibited by controlling the height of a HDP oxide film using the thickness of a pad nitride film, an increase in the thickness of an oxide film on the active region using oxidization of a buffer polysilicon film, and the dip time of DHF. Further, the height of the floating gate can be controlled through the CMP process for the polysilicon layer. In addition, various process margins such as controlling of the surface area of the floating gate through pretreatment of the dielectric film can be secured Further, the present invention can easily secure a process margin for implementing a flash memory cell having a high integration level of over 0.13 μm using the existing equipment and process without additional and complicated processes/equipments.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory cell, comprising the steps of:
   forming a pad layer on a semiconductor substrate;
   forming a trench in the semiconductor substrate;
   after the trench is formed, forming a sacrificial oxide film on an inner surface of the trench;
   removing the sacrificial oxide film and then forming a wall oxide film on the inner surface of the trench;
   forming a liner oxide film on the wall oxide film in the trench and the pad layer;
   forming a trench insulating film in the trench having a protrusion sufficient to bury the trench;
   forming a floating gate isolated by the protrusion, wherein an upper portion of the floating gate has rugged portions; and
   forming a dielectric film and a control gate on the floating gate.

2. The method as claimed in claim 1, wherein the pad layer has a stack structure of a pad oxide film and a pad nitride film.

3. The method as claimed in claim 2, wherein the pad oxide film is formed in thickness of 70 through 100 Å by a dry or wet oxidization method at a temperature of 750 through 900° C.

4. The method as claimed in claim 2, wherein the pad nitride film is formed in thickness of 2500 through 3500 Å.

5. The method as claimed in claim 1, wherein an inner surface of the trench has a tilt angle of 75° through 85°.

6. The method as claimed in claim 1, wherein the sacrificial oxide film is formed in thickness of 150 through 250 Å on the inner surface of the trench by a dry oxidization method at a temperature of 1000 through 1150° C.

7. The method as claimed in claim 1, wherein the wall oxide film is formed in thickness of 300 through 450 Å by a wet oxidization method at a temperature of 750 through 850° C.

8. The method as claimed in claim 1, wherein the liner oxide film is formed in thickness of 100 through 120 Å, by thinly depositing high temperature oxide (HTO) containing dichloro silane $SiH_2Cl_2$ as a integral component and then performing a fineness process at a high temperature.

9. The method as claimed in claim 8, wherein the fineness process is performed under $N_2$ atmosphere at a temperature of 1000 through 1100° C. for 20 through 39 minutes.

10. The method as claimed in claim 1, wherein the step of forming the trench insulating film comprises the steps of:
    depositing a high-density plasma oxide film on the entire surfaces by a gap filling process;
    performing a chemical mechanical polishing process using an upper layer of the pad layer as a stop barrier;
    removing the upper layer of the pad layer to expose the protrusion of the trench insulating film; and
    removing a lower layer of the pad layer and simultaneously performing an etch process for etching the protrusion by a given width.

11. The method as claimed in claim 10, wherein the upper layer of the pad layer is removed by a cleaning process using $H_3PO_4$ dip out.

12. The method as claimed in claim 10, wherein the etch process is performed with a cleaning process using diluted HF (DHF) and standard cleaning-1 solution (a solution where $NH_4OH/H_2O_2/H_2O$ solution is mixed at a given ration) wherein the HF dip out time is set to completely remove the lower layer of the pad layer.

13. The method as claimed in claim 10, further comprising the steps of:
    before the floating gate is formed, forming a screen oxide film having a thickness of 50 through 70 Å on the semiconductor substrate by means of a wet or dry oxidization process at a temperature of 750 through 900° C.;
    performing a wall ion implantation process and a threshold voltage ion implantation process to form a wall region and an impurity region on the semiconductor substrate; and
    removing the screen oxide film and then forming a tunnel oxide film.

14. The method as claimed in claim 13, wherein the tunnel oxide film is formed by performing a wet oxidization process at a temperature of 750 through 800° C. and then performing an annealing process using $N_2$ at a temperature of 900 through 910° C. for 20 through 30 minutes.

15. A method of manufacturing a flash memory cell, comprising the steps of:
    forming a pad layer on a semiconductor substrate;
    forming a trench in the semiconductor substrate;
    forming a trench insulating film in the trench having a protrusion sufficient to bury the trench;
    forming a floating gate isolated by the protrusion wherein an upper portion of the floating gate has rugged portions; and
    forming a dielectric film and a control gate on the floating gate,
    wherein the step of forming the floating gate comprises the steps of:
    forming a polysilicon layer on the entire surfaces;
    performing a chemical mechanical polishing process using the protrusion as a stop barrier to isolate the polysilicon layer; and
    performing an etch process to etch an upper portion of the polysilicon in a rugged shape.

16. The method as claimed in claim 15, wherein the polysilicon layer is formed by a low-pressure chemical vapor deposition (LP-CVD) method having a temperature of 580 through 620° C. and a low pressure of 0.1 through 3Torr under a $SiH_4$ or $Si_2H_6$ and $PH_3$ gas atmosphere.

17. The method as claimed in claim 15, wherein the polysilicon layer is uniformly isolated in thickness of 1000 through 1400 Å.

18. The method as claimed in claim 15, wherein the rugged portions are formed to have a depth of 200 through 400 Å from the top of the polysilicon layer.

19. A method of manufacturing a flash memory cell, comprising the steps of:

forming a pad layer on a semiconductor substrate;

forming a trench in the semiconductor substrate;

forming a trench insulating film in the trench having a protrusion sufficient to bury the trench;

forming a floating gate isolated by the protrusion, wherein an upper portion of the floating gate has rugged portions; and forming a dielectric film and a control gate on the floating gate, wherein the step of forming the floating crate comprises the steps of:

forming a polysilicon layer on the entire surfaces;

performing a chemical mechanical polishing process using the protrusion as a stop barrier to isolate the polysilicon layer; and performing an etch process to etch an upper portion of the polysilicon in a rugged shape, and wherein the dielectric film includes:

a first oxide film that is formed in thickness of 35 through 60 Å using high temperature oxide (HTO) using dichloro silane ($SiH_2Cl_2$) and $N_2O$ gas as a source gas;

a nitride film that is formed in thickness of 50 through 65 Å on the first oxide film by a low-pressure chemical vapor deposition (LP-CVD) method using $NH_3$ and dichloro silane ($SiH_2Cl_2$) gas as an reaction gas at a temperature of 650 through 800° C. and a low pressure of 1 through 3 Torr; and a second oxide film that is formed in thickness of 35 through 60 Å on the nitride film using HTO using DCS($SiH_2Cl_2$) and $N_2O$ gas as a source gas.

20. A method of manufacturing a flash memory cell, comprising the steps of:

forming a pad layer on a semiconductor substrate;

forming a trench in the semiconductor substrate;

forming a trench insulating film having a protrusion sufficient to bury the trench;

forming a floating gate isolated by the protrusion, wherein an upper portion of the floating gate has rugged portions;

forming a dielectric film and a control gate on the floating gate, wherein the step of forming the floating gate comprises the steps of:

forming a polysilicon layer on the entire surfaces;

performing a chemical mechanical polishing process using the protrusion as a stop barrier to isolate the polysilicon layer; and performing an etch process to etch an upper portion of the polysilicon in a rugged shape;

performing a steam annealing process using a wet oxidization method at a temperature of 750 through 800° C.; and forming a control gate on the dielectric film.

21. A method of manufacturing a flash memory cell, comprising the steps of:

forming a pad layer on a semiconductor substrate;

forming a trench in the semiconductor substrate;

forming a trench insulating film having a protrusion sufficient to bury the trench;

forming a floating gate isolated by the protrusion, wherein an upper portion of the floating gate has rugged portions; and forming a dielectric film and a control gate on the floating gate, wherein the step of forming the floating gate comprises the steps of:

forming a polysilicon layer on the entire surfaces;

performing a chemical mechanical polishing process using the protrusion as a stop barrier to isolate the polysilicon layer; and performing an etch process to etch an upper portion of the polysilicon in a rugged shape, and wherein the control gate is formed to have a dual structure of a doped layer and an undoped layer by a LP-CVD method.

22. The method as claimed in claim 21, wherein the total thickness of the doped layer and the undoped layer is 500 through 1000 Å at the ratio of 1:2 through 6:1.

23. The method as claimed in claim 1, wherein the control gate is formed at a temperature of 510 through 550° C. and a low pressure of 0.1 through 3 Torr.

24. A method of manufacturing a flash memory cell, comprising the steps of:

forming a pad layer on a semiconductor substrate;

forming a trench in the semiconductor substrate;

forming a trench insulating film having a protrusion sufficient to bury the trench;

forming a floating gate isolated by the protrusion, wherein an upper portion of the floating gate has rugged portions;

forming a dielectric film and a control gate on the floating gate, wherein the step of forming the floating gate comprises the steps of:

forming a polysilicon layer on the entire surfaces;

performing a chemical mechanical polishing process using the protrusion as a stop barrier to isolate the polysilicon layer; and performing an etch process to etch an upper portion of the polysilicon in a rugged shape; and forming a tungsten suicide layer having a stoichiometry of 2.0 through 2.8 using reaction of mono silane ($SiH_4$) or dichloro silane ($SiH_2Cl_2$) and $WF_6$ at a temperature of 300 through 500° C.

25. The method as claimed in claim 1, wherein the step of forming the floating gate comprises the steps of:

forming a polysilicon layer on the entire surface;

performing a chemical mechanical polishing process using the protrusion as a stop barrier to isolate the polysilicon layer; and performing an etch process to etch an upper portion of the polysilicon in a rugged shape.

26. The method as claimed in claim 15, further comprising the steps of:

after the trench is formed, forming a sacrificial oxide film on the inner surface of the trench;

after the sacrificial oxide film is removed, forming a wall oxide film; and forming a liner oxide film on the inner surface of the trench.

* * * * *